United States Patent
Yoo

(10) Patent No.: US 9,413,343 B2
(45) Date of Patent: Aug. 9, 2016

(54) METHOD FOR REDUCING NOISE USING LAYOUT SCHEME AND COMPARING DEVICE

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 14/476,407

(22) Filed: Sep. 3, 2014

(65) Prior Publication Data
US 2015/0270834 A1 Sep. 24, 2015

(30) Foreign Application Priority Data
Mar. 21, 2014 (KR) .......... 10-2014-0033465

(51) Int. Cl.
*H03K 5/1252* (2006.01)
*H03K 5/24* (2006.01)

(52) U.S. Cl.
CPC .......... *H03K 5/1252* (2013.01); *H03K 5/24* (2013.01)

(58) Field of Classification Search
CPC ............ B60T 8/00; B60T 8/885; B61L 1/00; B61L 1/20; G01P 1/00; G01P 1/103; G01R 19/00; G01R 19/0038; H01L 27/00; H01L 27/146; H01L 27/14609; H01L 27/14643; H03K 5/00; H03K 5/1252; H03K 5/24; H03K 5/2418
USPC .......................................................... 327/88
See application file for complete search history.

(56) References Cited

U.S. PATENT DOCUMENTS

2006/0141963 A1* 6/2006 Maxim ................. H03L 7/0891
455/192.1
2011/0234433 A1* 9/2011 Aruga ................. H01L 23/5223
341/172

FOREIGN PATENT DOCUMENTS

JP 2011-205230 10/2011

* cited by examiner

*Primary Examiner* — John Poos
*Assistant Examiner* — David Mattison
(74) *Attorney, Agent, or Firm* — IP & T Group LLP

(57) ABSTRACT

A comparing device includes a first stage comparator and a second stage comparator serially coupled to the first stage comparator, wherein output lines of the second stage comparator are disposed to be overlapped with respective input lines of the second stage comparator.

18 Claims, 4 Drawing Sheets

METHOD FOR REDUCING NOISE USING LAYOUT SCHEME AND COMPARING DEVICE

CROSS-REFERENCE TO RELATED APPLICATIONS

The present application claims priority of Korean Patent Application No. 10-2014-0033465, filed on Mar. 21, 2014, which is incorporated herein by reference in its entirety.

BACKGROUND

1. Field

Various embodiments of the present invention relate to a complementary metal oxide semiconductor (CMOS) image sensor and, more particularly, to a method for reducing horizontal noise of the CMOS image sensor using a layout scheme and a comparing device.

2. Description of the Related Art

In CMOS image sensors using single-slope analog-to-digital converters, data is distorted by various noises. Noise may occur in both the pixel signals (outputted from the pixel array) and the ramp signal (outputted from a ramp signal generation device) when the data of each row of pixels is processed. This noise is called horizontal noise.

As the number of pixels in the CMOS image sensor increases, the pitch of the pixels is reduced. If the pitch is too small, passive elements (e.g., a capacitor) may not be able to be accommodated because the size of the passive element may be larger than the pixel pitch and the layout of interconnection lines for coupling the passive elements may be difficult.

SUMMARY

Various embodiments of the present invention are directed to a method for reducing horizontal noise in CMOS image sensors using a layout scheme without using an additional capacitor, and a comparing device.

Various embodiments of the present invention are directed to a method for reducing horizontal noise of a CMOS image sensor using a layout scheme, and a comparing device by closely disposing an input line and an output line of a second stage comparator, increasing parasitic capacitance, inducing a Miller effect, increasing loading capacitance of an output line of a first stage comparator, reducing bandwidth of a comparing device, and reducing noise higher than a specific frequency inducing horizontal noise of the CMOS image sensor.

In accordance with an embodiment of the present invention, a method for reducing noise may include increasing parasitic capacitance by disposing an input line and an output line of a second stage comparator adjacent to each other, wherein the second stage comparator is disposed behind a first stage, which is coupled to the second stage comparator out of a plurality of stage comparators, increasing an input capacitance generated on the input line of the second stage comparator due to a Miller effect caused by an increased parasitic capacitance, and reducing noise having a frequency higher than a predetermined frequency through a reduction of bandwidth of a comparing device caused by an increased input capacitance.

In accordance with an embodiment of the present invention, a method for reducing a noise may include increasing a parasitic capacitance by disposing an input line and an output line of a second stage comparator adjacent to each other, wherein the second stage comparator is disposed behind a first stage comparator, which is coupled to the second stage comparator out of a plurality of stage comparators, increasing an input capacitance generated on the input line of the second stage comparator due to a Miller effect caused by an increased parasitic capacitance, and reducing a noise having a frequency higher than a predetermined frequency through a reduction of a bandwidth caused by an increased input capacitance.

In accordance with an embodiment of the present invention, a comparing device may include a first stage comparator, and a second stage comparator disposed behind the first stage comparator coupled to the second stage comparator, wherein a parasitic capacitance is increased by disposing an input line and an output line of the second stage comparator adjacent to each other, an input capacitance generated on the input line of the second stage comparator due to a Miller effect caused by an increased parasitic capacitance is increased, and a noise having a frequency higher than a predetermined frequency through a reduction of a bandwidth of a comparing device caused by an increased input capacitance is reduced.

In accordance with an embodiment of the present invention, a comparing device may include a first stage comparator, and a second stage comparator serially coupled to the first stage comparator, wherein output lines of the second stage comparator are disposed to be overlapped with respective input lines of the second stage comparator.

DETAILED DESCRIPTION

Figure 1:
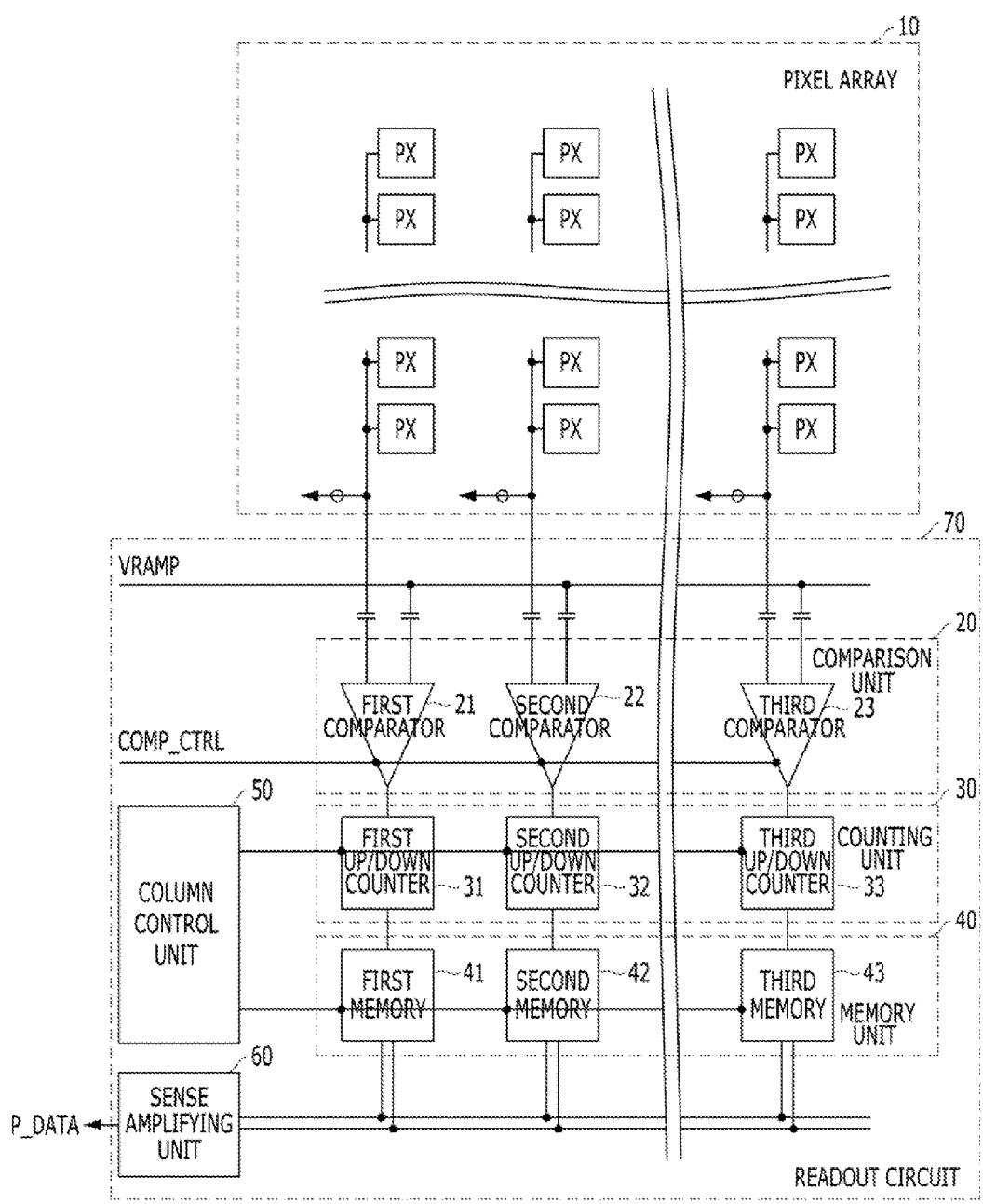
FIG. 1 is a block diagram illustrating a CMOS image sensor having a column parallel structure.

Exemplary embodiments of the present invention will be described below in more detail with reference to the accompanying drawings. The present invention may however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to clearly illustrate features of the embodiments. In this specification, specific terms have been used. The terms are used to describe the present invention and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a block diagram illustrating a CMOS image sensor having a column parallel structure.

Referring to FIG. 1, a CMOS image sensor includes a pixel array 10 and a readout circuit 70. The pixel array 10 includes a plurality of pixels PXs arrayed in rows and columns. The readout circuit 70 includes a comparison unit 20, a counting unit 30, a memory unit 40, a column control unit 50 and a sense amplifying unit 60.

The pixel array 10 outputs a pixel signal corresponding to incident light. The comparison unit 20 compares a value of a pixel signal outputted from the pixel array 10 with a value of a ramp signal VRAMP applied from an external voltage generation unit (not shown) in response to a comparator control signal COMP_CTRL transferred from an external CMOS image sensor controller (not shown).

The counting unit 30 counts an output signal outputted from the comparison unit 20. The memory unit 40 stores counting information received from the counting unit 30.

The column control unit 50 controls the operations of the counting unit 30 and the memory unit 40. The sense amplifying unit 60 amplifies a signal corresponding to data stored in and outputted from the memory unit and outputs pixel data P_DATA.

Herein, the comparison unit 20 includes a first comparator 21, a second comparator 22 and a third comparator 23. The counting unit 30 includes a first up/down counter 31, a second up/down counter 32 and a third up/down counter 33. The memory unit 40 includes a first memory 41, a second memory 42 and a third memory 43. In another embodiment of the present invention, another memory may be used as the first, second and third up/down counters 31, 32 and 33.

Subsequently, the first comparator 21, the first up/down counter 31 and the first memory 41 will be exemplarily explained as below.

The first comparator 21 receives a pixel signal outputted from a first column pixel of the pixel array 10 through a first terminal, and a ramp signal VRAMP applied from an external voltage generation unit (not shown) through a second terminal, and compares a value of the pixel signal with a value of the ramp signal VRAMP in response to a comparator control signal COMP_CTRL transferred from an external CMOS image sensor controller.

Since the voltage of the ramp signal VRAMP is decreased as a time elapses, at some point the value of the pixel signal become same as the value of the ramp signal VRAMP. An output value of the first comparator 21 is inverted after the value of the pixel signal becomes the same as the value of the ramp signal VRAMP.

The first up/down counter 31 counts until the output of the first comparator 21 is inverted after the ramp signal VRAMP is decreased.

The first memory 41 stores a value (counting information) counted in the first up/down counter 31, and outputs the stored counting information.

However, in a CMOS image sensor using a single-slope analog-digital converter, data may be distorted by various noises in the pixel signal (from the pixel array) and the ramp signal (from the ramp signal generator, which is not illustrated) whenever the data of each row is processed. This noise is called horizontal noise.

As the number of pixels in a CMOS image sensor is increased, the pitch of the pixels is reduced. Thus, if the layout pitch of a comparing device is reduced, passive elements (e.g., a capacitor) may not be used because they are larger than the pitch of the pixels. Additionally, the layout interconnection lines for coupling the passive element may be difficult.

In an embodiment, horizontal noise of the CMOS image sensor may be reduced by using a layout scheme without an additional capacitor. A comparing device in accordance with embodiments of the present invention will be described in detail below with reference to FIGS. 2 to 4.

Figure 2:
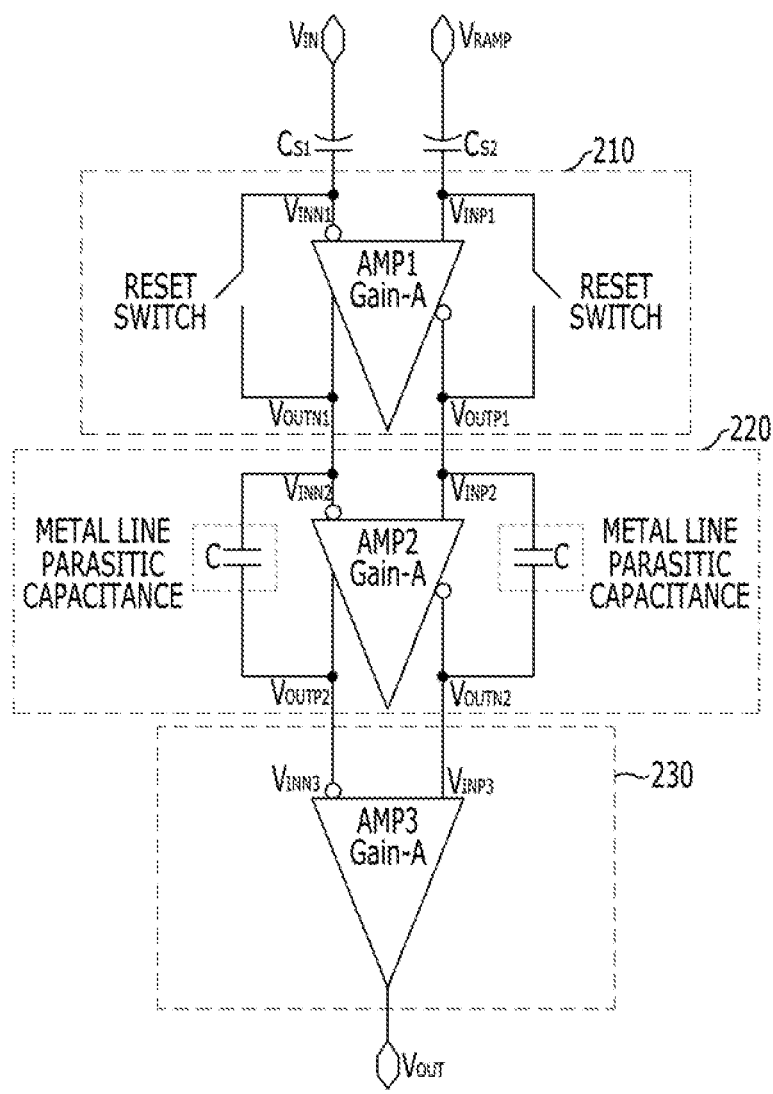
FIG. 2 is a circuit diagram illustrating a comparing device in accordance with an embodiment of the present invention.

FIG. 2 is a circuit diagram illustrating a comparing device in accordance with an embodiment of the present invention. For reference, the comparing device may correspond to one of the comparators 21 to 23 shown in FIG. 2.

Referring to FIG. 2, the comparing device may include a first stage comparator (AMP1) 210, a second stage comparator (AMP2) 220 and a third stage comparator (AMP3) 230.

The first stage comparator 210 receives a pixel signal outputted from a pixel array through a first input line $V_{INN1}$ and receives a ramp signal for a ramp voltage) outputted from a ramp signal generation device through a second input line $V_{INP1}$. A first input line $V_{INN2}$ of the second stage comparator 220 is coupled to a first output line $V_{OUTN1}$ of the first stage comparator 210. A second input line $V_{INP2}$ of the second stage comparator 220 is coupled to a second output line $V_{OUTP1}$ of the second stage comparator 220. A first input line $V_{INN3}$ of the third stage comparator 230 is coupled to a first output line $V_{OUTN2}$ of the second stage comparator 220. A second input line $V_{INP3}$ of the third stage comparator 230 is coupled to a second output line $V_{OUTP2}$ of the second stage comparator 220. The input lines and the output lines of the respective comparators may be implemented by metal lines.

A metal line parasitic capacitance is generated between the first input line $V_{INN2}$ of the second stage comparator 220 and the first output line $V_{OUTN2}$ of the second stage comparator 220 and between the second input line $V_{INP2}$ of the second stage comparator 220 and the second output line $V_{OUTP2}$ of the second stage comparator 220.

Figure 3:
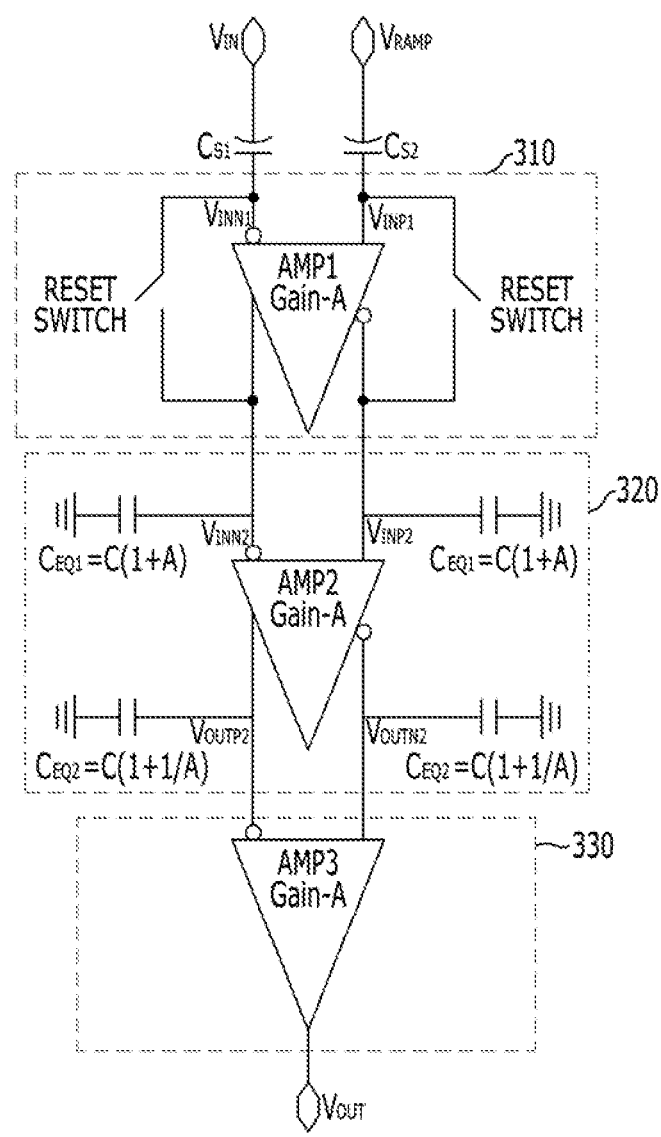
FIG. 3 is a block diagram for describing a Miller effect of a comparing device in accordance with an embodiment of the present invention.

FIG. 3 is a block diagram for describing a Miller effect of a comparing device in accordance with an embodiment of the present invention.

Referring to FIG. 3, the comparing device may include a first stage comparator (AMP1) 310, a second stage comparator (AMP2) 320 and a third stage comparator (AMP2) 330.

If a first input line $V_{INN2}$ of the second stage comparator 320 and a first output line $V_{OUTN2}$ of the second stage comparator 320 are disposed adjacent to each other, and a second input line $V_{INP2}$ of the second stage comparator 320 and a second output line $V_{OUTP2}$ of the second stage comparator 320 are disposed adjacent to each other, metal line parasitic capacitance C generated between adjacent metal lines is increased. The input lines and the output lines of the respective comparators may be implemented by metal lines.

A value of an input capacitance between the first input line $V_{INN2}$ of the second stage comparator 320 and the second input line $V_{INP2}$ of the second stage comparator 320 is increased by a Miller effect caused by the increased metal line parasitic capacitance C. That is, as shown in FIG. 3, the input capacitance having value of "$C_{EQ1}=C(1+A)$" is generated between the first input line $V_{INN2}$ of the second stage comparator 320 and the second input line $V_{INP2}$ of the second stage comparator 320, where "C" denotes the metal line parasitic capacitance, and "A" denotes a gain of the second stage comparator. The output capacitance having value of "$C_{EQ2}=C(1+1/A)$" is generated between the first output line $V_{OUTN2}$ of the second stage comparator 320 and the second output line $V_{OUTP2}$ of the second stage comparator 320, where "C"

denotes the metal line parasitic capacitance, and "A" denotes a gain of the second stage comparator.

Figure 4:
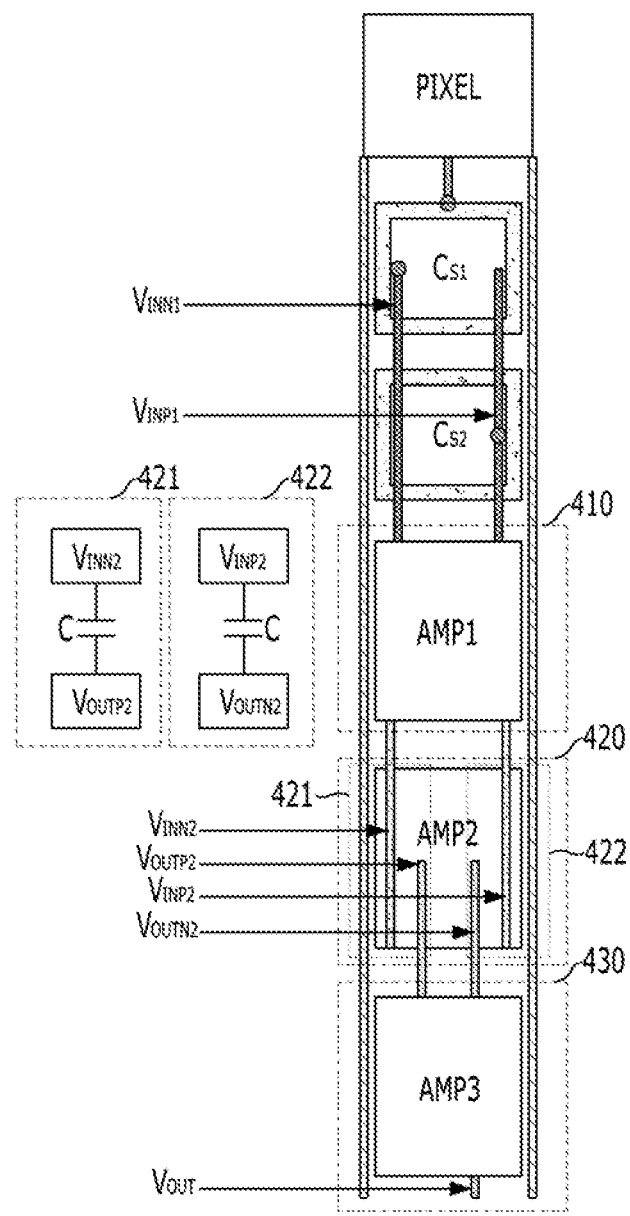
FIG. 4 is a layout diagram illustrating a Miller effect of a comparing device in accordance with an embodiment of the present invention.

FIG. 4 is a layout diagram illustrating a comparing device in accordance with an embodiment of the present invention.

Referring to FIG. 4, the comparing device may include a first stage comparator (AMP1) 410, a second stage comparator (AMP2) 420 and a third stage comparator (AMPS) 430.

A metal line parasitic capacitance C is increased by disposing the input line of the second stage comparator 420 and the output line of the second stage comparator 420 adjacent to each other. That is, a metal line parasitic capacitance C generated between adjacent lines is increased by disposing a first input line $V_{INN2}$ and a first output line $V_{OUTN2}$ of the second stage comparator 420 to be adjacent to each other in a vertical direction or in a horizontal direction, and by disposing a second input line $V_{INP2}$ and a second output line $V_{OUTP2}$ of the second stage comparator 420 to be adjacent to each other in a vertical direction or in a horizontal direction.

From another point of view, the input line of the second stage comparator 420 and the output line of the second stage comparator 420 are overlapped with each other in a vertical direction. Furthermore, the input line of the second stage comparator 420 and the corresponding output line of the second stage comparator 420 are disposed to be adjacent to each other without a line interposed therebetween, and to be overlapped each other in a horizontal direction. Meanwhile the input line of the second stage comparator 420 and the output lines of the second stage comparator 420 are disposed to be extended over the second stage comparator.

In case in which the first input line $V_{INN2}$ and the first output line $V_{OUTN2}$ of the second stage comparator 420 are disposed adjacent to each other in a horizontal direction, and the second input line $V_{INP2}$ and the second output line $V_{OUTP2}$ of the second stage comparator 420 are disposed adjacent to each other in a horizontal direction, it is preferred that the interval distance between the first input line $V_{INN2}$ and the first output line $V_{OUTN2}$ of the second stage comparator 420, and the interval distance between the second input line $V_{INP2}$ and the second output line $V_{OUTP2}$ of the second stage comparator 420 are shorter than a half of the layout pitch. In a case in which the first input line $V_{INN2}$ and the first output line $V_{OUTN2}$ of the second stage comparator 420 are disposed adjacent to the top and bottom, and the second input line $V_{INP2}$ and the second output line $V_{OUTP2}$ of the second stage comparator 420 are disposed adjacent to the top and bottom, it is preferred that the interval distance between the first input line $V_{INN2}$ and the first output line $V_{OUTN2}$ of the second stage comparator 420, and the interval distance between the second input line $V_{INP2}$ and the second output line $V_{OUTP2}$ of the second stage comparator 420 are shorter than a half of a layout thickness (e.g., a half of a pixel pitch).

The metal line parasitic capacitance C is increased more as each of the intervals between the first input line $V_{INN2}$ and the first output line $V_{OUTN2}$ of the second stage comparator 420 and between the second input line $V_{INP2}$ and the second output fine $V_{OUTP2}$ of the second stage comparator 420 is minimized. Moreover, it is preferred that the first input line $V_{INN2}$ and the first output line $V_{OUTN2}$ of the second stage comparator 420 are overlapped, and the second input line $V_{INP2}$ and the second output line $V_{OUTP2}$ of the second stage comparator 420 are overlapped. The input lines and the output lines of the respective comparators may be implemented by a metal lines.

Subsequently, the value of an input capacitance (that is, a loading capacitance of an output of the first stage comparator) generated on the input line of the second stage comparator 420 is increased due to a Miller effect caused by the increased metal line parasitic capacitance C. That is, the value of the input capacitance generated on the first input line $V_{INN2}$ and the second input line $V_{INP2}$ of the second stage comparator 420 is increased due to the Miller effect caused by the metal line parasitic capacitance C.

Next, the bandwidth of the comparing device may be reduced by the increased value of the input capacitance. That is, the bandwidth of the comparing device may be totally reduced by increasing the input capacitance generated on the first input line $V_{INN2}$ and the second input line $V_{INP2}$ of the second stage comparator 420.

A noise having a frequency higher than a predetermined frequency, which causes a horizontal noise in the CMOS image sensor, may be reduced through the reduction of the bandwidth of the comparing device.

As described above, a comparing device having three stage comparators is exemplary described in embodiments of the present invention. However, a comparing device having a plurality of stage comparators, e.g., four stage comparators, five stage comparators or six stage comparators may be applicable. Moreover, a case where an input line and an output line of a second stage comparator are disposed adjacent to each other is exemplary described in embodiments of the present invention. However, a case where an input line and an output line of a third stage comparator or a fourth stage comparator are disposed adjacent to each other may be implemented in another embodiment of the present invention.

A comparing device in accordance with the aforementioned embodiments of the present invention may be used in various devices for acquiring the Miller effect by generating a metal line parasitic capacitance using a layout scheme.

As described above, a comparing device in accordance with the embodiments of the present invention may reduce a noise having a frequency higher than the predetermined frequency, which causes a horizontal noise in the CMOS image sensor, and may be applied to a comparing device, which are integrated with a pixel pitch of a minimum size, since an additional capacitor element and an interconnection line coupling the addition capacitor element are not used. Moreover, a comparing device in accordance with the embodiments of the present invention may be used for various devices irrespective of an operation point condition thereof.

While the present invention has been described with respect to the specific embodiments, it will be apparent to those skilled in the art that various changes and modifications may be made without departing from the spirit and scope of the invention as defined in the following claims.

What is claimed is:

1. A method for reducing noise, comprising:
increasing a parasitic capacitance by disposing an input line and an output line of a second stage comparator adjacent to each other, wherein the second stage comparator is disposed behind a first stage comparator, which is coupled to the second stage comparator, out of a plurality of stage comparators;
increasing an input capacitance generated on the input line of the second stage comparator due to a Miller effect caused by an increased parasitic capacitance; and
reducing noise having a frequency higher than a predetermined frequency through a reduction of a bandwidth of a comparing device caused by an increased input capacitance,
wherein the input line and the output line of the second stage comparator are adjacent to each other in a horizontal direction, and an interval distance between the input line and the output line of the second stage comparator is shorter than a half of a layout pitch.

2. The method for reducing noise of claim 1, wherein the increasing of the parasitic capacitance includes increasing the parasitic capacitance by disposing a first input line and a first output line of the second stage comparator to be adjacent to each other in the horizontal direction, and by disposing a second input line and a second output line of the second stage comparator to be adjacent to each other in the horizontal direction.

3. The method for reducing noise of claim 2, wherein an interval distance between the first input line and the first output line of the second stage comparator and an interval distance between the second input line and the second output line of the second stage comparator are shorter than the half of the layout pitch, respectively.

4. The method for reducing noise of claim 2, wherein the first input line and the first output line of the second stage comparator are overlapped, and the second input line and the second output line of the second stage comparator are overlapped.

5. A method for reducing noise, comprising:
increasing a parasitic capacitance by disposing an input line and an output line of a second stage comparator adjacent to each other, wherein the second stage comparator is disposed behind a first stage comparator, which is coupled to the second stage comparator, out of a plurality of stage comparators;
increasing an input capacitance generated on the input line of the second stage comparator due to a Miller effect caused by an increased parasitic capacitance; and
reducing noise having a frequency higher than a predetermined frequency through a reduction of a bandwidth of a comparing device caused by an increased input capacitance,
wherein the input line and the output line of the second stage comparator are adjacent to each other in a direction of top to bottom, and an interval distance between the input line and the output line of the second stage comparator is shorter than a half of a layout thickness.

6. The method for reducing noise of claim 5, wherein the increasing of the parasitic capacitance includes increasing the parasitic capacitance by disposing a first input line and a first output line of the second stage comparator adjacent to each other in the direction of top to bottom, and disposing a second input line and a second output line of the second stage comparator adjacent to each other in a direction from top to bottom.

7. The method for reducing noise of claim 6, wherein an interval distance between the first input line and the first output line of the second stage comparator and an interval distance between the second input line and the second output line of the second stage comparator are shorter than the half of the layout thickness, respectively.

8. The method for reducing noise of claim 6, wherein the first input line and the first output line of the second stage comparator are disposed to be overlapped, and the second input line and the second output line of the second stage comparator are disposed to be overlapped.

9. A method for reducing noise, comprising:
increasing a parasitic capacitance by disposing an input line and an output line of a second stage comparator adjacent to each other, wherein the second stage comparator is disposed behind a first stage comparator, which is coupled to the second stage comparator out of a plurality of stage comparators;
increasing an input capacitance generated on the input line of the second stage comparator due to a Miller effect caused by an increased parasitic capacitance; and
reducing a noise having a frequency higher than a predetermined frequency through a reduction of a bandwidth caused by an increased input capacitance,
wherein the input line and the output line of the second stage comparator are adjacent to each other in a horizontal direction, and an interval distance between the input line and the output line of the second stage comparator is shorter than a half of a layout pitch.

10. The method for reducing noise of claim 9, wherein the increasing of the parasitic capacitance includes increasing the parasitic capacitance by disposing a first input line and a first output line of the second stage comparator to be adjacent to each other in the horizontal direction, by disposing a second input line and a second output line of the second stage comparator to be adjacent each other in the horizontal direction.

11. A comparing device for reducing noise, comprising:
a first stage comparator; and
a second stage comparator disposed behind the first stage comparator coupled to the second stage comparator,
wherein a parasitic capacitance is increased by disposing an input line and an output line of the second stage comparator adjacent to each other, an input capacitance generated on the input line of the second stage comparator due to a Miller effect caused by an increased parasitic capacitance is increased, and a noise having a frequency higher than a predetermined frequency through a reduction of a bandwidth of a comparing device caused by an increased input capacitance is reduced,
wherein the input line and the output line of the second stage comparator are adjacent to each other in a horizontal direction, and an interval distance between the input line and the output line of the second stage comparator is shorter than a half of a layout pitch.

12. The comparing device for reducing noise of claim 11, wherein the parasitic capacitance is increased by disposing a first input line and a first output line of the second stage comparator to be adjacent to each other in the horizontal direction, and by disposing a second input line and a second output line of the second stage comparator to be adjacent to each other in the horizontal direction.

13. The comparing device for reducing noise of claim 12, wherein an interval distance between the first input line and the first output line of the second stage comparator and an interval distance between the second input line and the second output line of the second stage comparator are shorter than the half of the layout pitch, respectively.

14. A comparing device for reducing noise, comprising:
a first stage comparator; and
a second stage comparator disposed behind the first stage comparator coupled to the second stage comparator,
wherein a parasitic capacitance is increased by disposing an input line and an output line of the second stage comparator adjacent to each other, an input capacitance generated on the input line of the second stage comparator due to a Miller effect caused by an increased parasitic capacitance is increased, and a noise having a frequency higher than a predetermined frequency through a reduction of a bandwidth of a comparing device caused by an increased input capacitance is reduced, and
wherein the input line and the output line of the second stage comparator are adjacent to each other in a direction of top to bottom, and an interval distance between the input line and the output line of the second stage comparator is shorter than a half of a layout thickness.

15. The comparing device for reducing noise of claim 14, wherein the parasitic capacitance is increased by disposing a first input line and a first output line of the second stage comparator adjacent to each other in the direction of top to bottom, and disposing a second input line and a second output line of the second stage comparator adjacent to the top and bottom.

16. The comparing device for reducing noise of claim 15, wherein an interval distance between the first input line and the first output line of the second stage comparator and an interval distance between the second input line and the second output line of the second stage comparator are shorter than the half of the layout thickness, respectively.

17. A comparing device, comprising:
    a first stage comparator; and
    a second stage comparator serially coupled to the first stage comparator,
    wherein output lines of the second stage comparator are disposed to be overlapped with respective input lines of the second stage comparator,
    each of the output lines of the second stage comparator is adjacent to the corresponding output line of the second stage comparator without a line interposed therebetween.

18. The comparing device of claim 17, wherein the output lines and input lines of the second stage comparator are overlapped with the second stage comparator.

* * * * *